US006842858B2

(12) United States Patent
Suzuki

(10) Patent No.: US 6,842,858 B2
(45) Date of Patent: Jan. 11, 2005

(54) MECHANISM FOR UPDATING FIRMWARE OF AN ELECTRONIC DEVICE

(75) Inventor: Takuya Suzuki, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 317 days.

(21) Appl. No.: 10/100,669

(22) Filed: Mar. 18, 2002

(65) Prior Publication Data

US 2002/0162098 A1 Oct. 31, 2002

(30) Foreign Application Priority Data

Mar. 19, 2001 (JP) .................................... P 2001-077763

(51) Int. Cl.[7] ........................... G06F 9/30; G06F 11/32; G06F 9/455
(52) U.S. Cl. ................. 713/2; 713/1; 711/102; 711/103; 711/104; 709/321; 709/328; 714/46; 714/47
(58) Field of Search ................................ 709/319, 320, 709/321, 327, 328, 330; 710/10, 13; 711/102, 103, 104; 712/220; 713/1, 2; 714/42, 44, 46, 47, 48; 717/168, 174

(56) References Cited

U.S. PATENT DOCUMENTS 5,325,532 A * 6/1994 Crosswy et al. ............... 713/2
5,341,499 A * 8/1994 Doragh ......................... 719/321
5,696,897 A * 12/1997 Dong ............................ 714/15
6,067,631 A * 5/2000 Choi ............................. 713/500
6,275,930 B1 * 8/2001 Bonamico ..................... 713/1
6,438,750 B1 * 8/2002 Anderson ..................... 717/178
6,463,530 B1 * 10/2002 Sposato ........................ 713/2
6,643,796 B1 * 11/2003 Floyd et al. .................. 714/10

FOREIGN PATENT DOCUMENTS

JP          06-044064 A      2/1994

* cited by examiner

Primary Examiner—B. James Peikari
(74) Attorney, Agent, or Firm—Osha & May L.L.P.

(57) ABSTRACT

A system for updating firmware of an electronic device includes a flash memory for storing a system control program to control the electronic device, and a RAM for storing the system control program and a writing control program to perform writing operation that the system program is loaded into the flash memory from the RAM. The system also includes a JTAG interface in conformity with the standard 1149.1 of IEEE (the Institute of Electrical and Electronics Engineers). The system stores the system control program and the writing control program into the RAM, and then executes the writing control program stored in the RAM to load the system control program into the flash memory. Thus, the firmware of the electronic device is updated.

15 Claims, 4 Drawing Sheets

MECHANISM FOR UPDATING FIRMWARE OF AN ELECTRONIC DEVICE

BACKGROUND OF THE INVENTION

1. Field of the Invention

The present invention relates to a mechanism for updating firmware of an electronic device, and in particular relates to a system and method for writing/updating a system control program stored in a flash memory of an electronic device.

2. Background Art

According to some related art, for example, as disclosed in the Unexamined Japanese Patent Application Publication No. 06-44064 A, a program to be stored in a flash memory of an electronic device is temporarily loaded into a RAM (random access memory), and another program, which controls writing operation to load the program into the flash memory, stored in a ROM (read only memory) in advance is executed. By way of this, the program temporarily stored in the RAM is loaded into the flash memory, and thereby, the firmware of the electronic device can be updated.

In the above related art, although the program temporarily stored in the RAM can be loaded into the flash memory, there has been a problem that the other program to perform such writing operation is required to be stored in the ROM in advance.

SUMMARY OF THE INVENTION

The invention is made from the aspect of consideration of the foregoing problem. An object of the invention is to provide a system that updates firmware of an electronic device in a manner that a system control program to be written into a flash memory and a writing control program to perform writing operation are temporarily stored in a RAM, and the system control program is loaded into the flash memory by execution of the writing control program stored in the RAM.

Further, another object of the invention is to provide a system that updates firmware of an electronic device in a manner that the system displays a write error when the write error occurs upon writing a system control program into the flash memory, and displays a verify error when contents of the system control program written into the flash memory does not match contents of the system control program stored in the RAM.

In order to achieve the objects, a system for updating firmware of an electronic device comprising: a first storage unit for storing a system control program controlling the electronic device; a second storage unit for temporarily storing the system control program and a writing control program that performs control of writing operations; and a control unit for controlling storage of a program to the second storage unit and execution of the writing control program; wherein the system control program and the writing control program are stored in the second storage unit by the control unit, and the writing control program stored in the second storage unit is executed by the control unit.

Further, a write error display unit for displaying a write error and a verification error display unit for displaying a verification error are provided. Thus, the write error is displayed when the write error occurs upon loading the system control program stored in the second storage unit into the first storage unit. In addition, the verification error is displayed when the contents of the system control program written in the first storage unit does not match the contents of the system control program stored in the second storage unit.

By way of this, the system control program to be loaded into the flash memory and the writing control program to control writing operations are temporarily stored in the RAM, and the system control program stored in the RAM can be loaded into the flash memory by execution of the writing control program stored in the RAM.

Further, the write error can be displayed when the write error occurs upon writing the system control program stored in the RAM into the flash memory. In addition, the verification error can be displayed when the contents of the system control program written in the flash memory does not match the contents of the system control program stored in the RAM.

Furthermore, a method for updating firmware of an electronic device is provided. The method comprises connecting a host computer to a JTAG interface of the electronic device; temporarily storing a system control program to control the electronic device and a writing control program to perform writing operation from the host computer into a second storage unit; detaching the host computer from the JTAG interface; conveying the electronic device; and executing the writing control program stored in the second storage unit to load the system control program from the second storage unit into a first storage unit.

Still further, the method further comprises displaying a write error when the write error occurs upon writing the system control program stored in the second storage unit into the first storage unit.

Still further, the method further comprises displaying a verification error when contents of the system control program written in the first storage unit does not match the contents of the system control program stored in the second storage unit under verification.

DETAILED DESCRIPTION OF THE PREFERRED EMBODIMENTS

Figure 1:
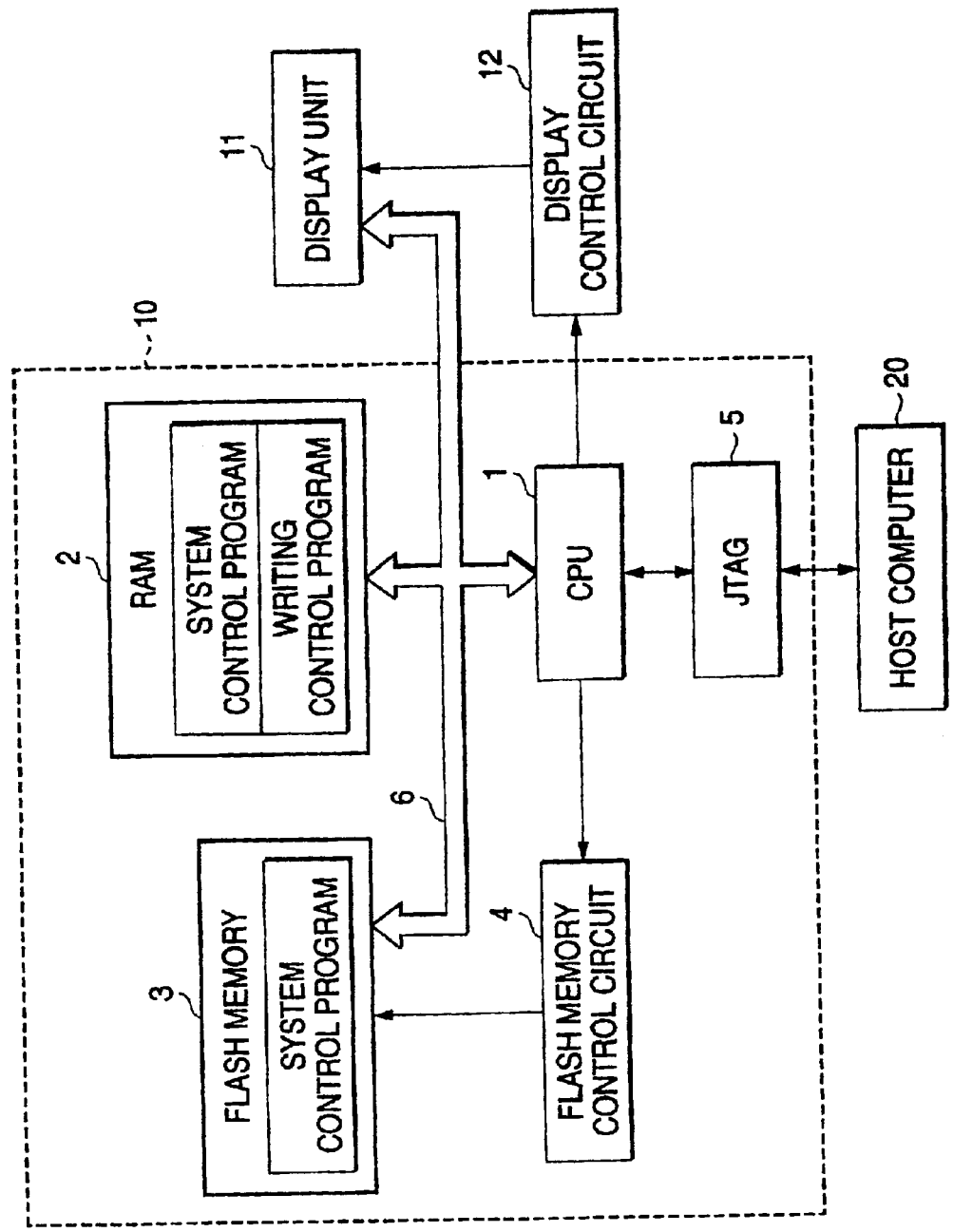
FIG. 1 is a block diagram showing the configuration of a system for updating firmware according to an embodiment of the invention.
Figure 2:
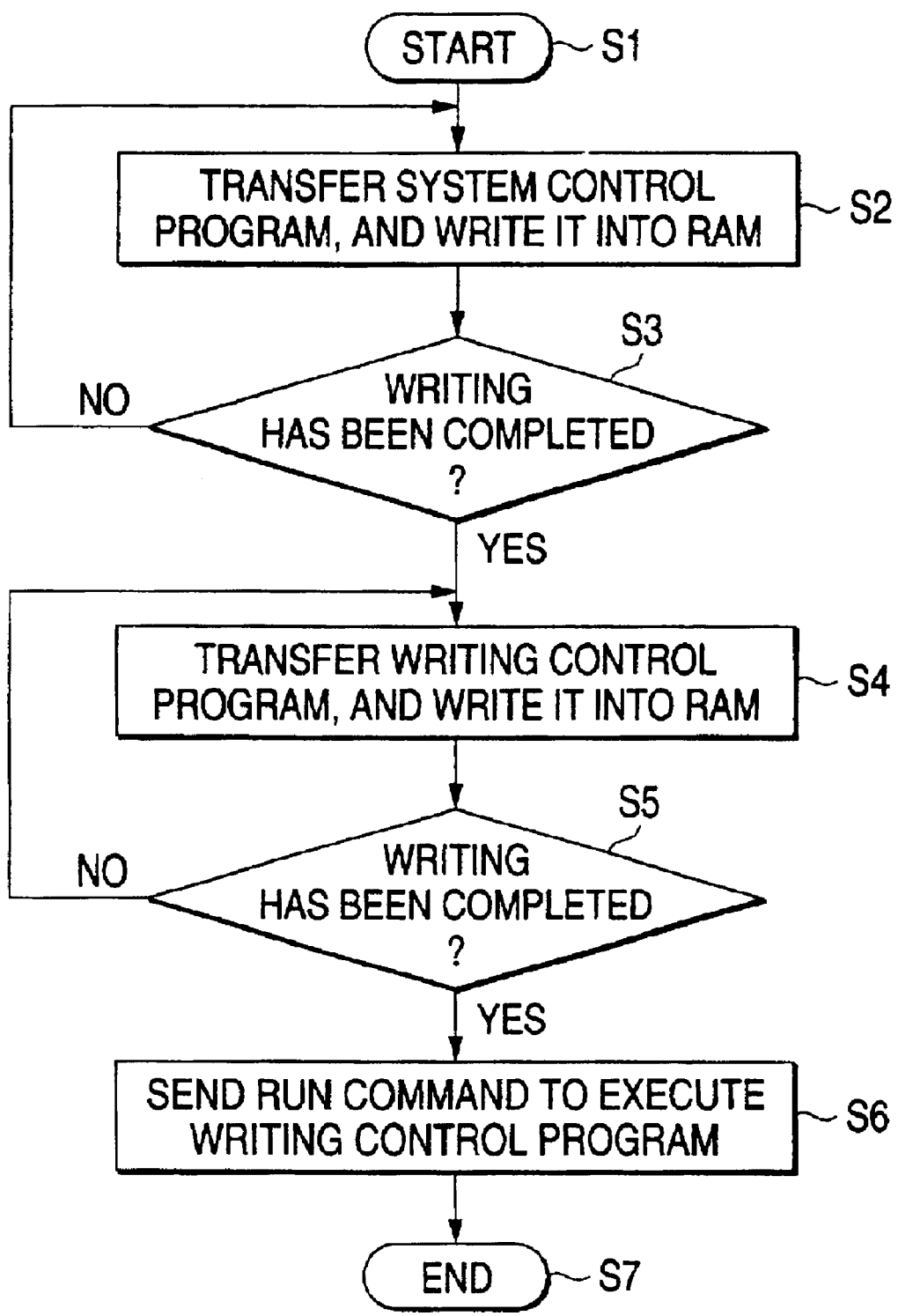
FIG. 2 is a flow chart showing the operation of transferring programs and sending a control command in the system according to an embodiment of the invention.
Figure 3:
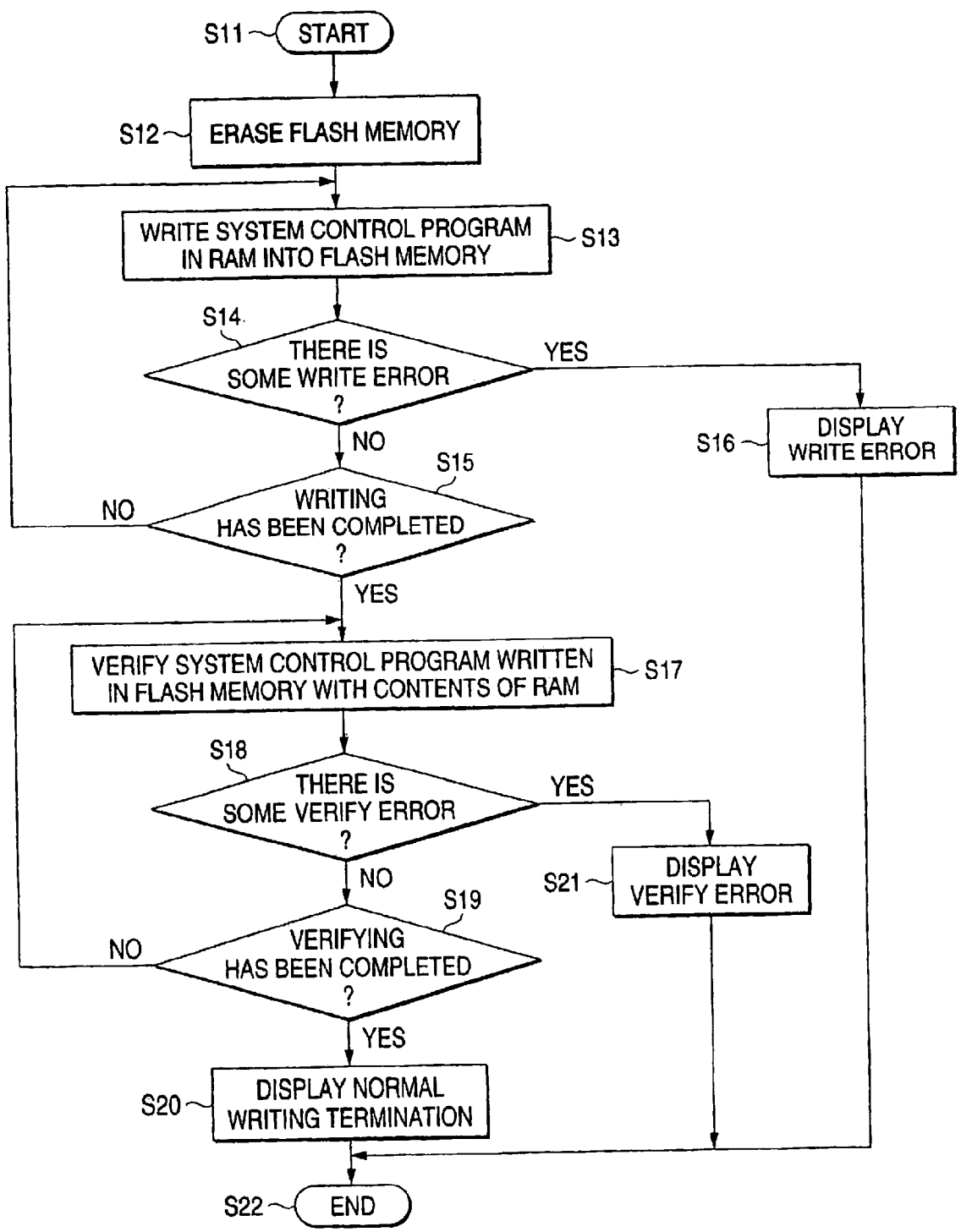
FIG. 3 is a flow chart showing the operation of writing firmware in the system according to an embodiment of the invention.
Figure 4:
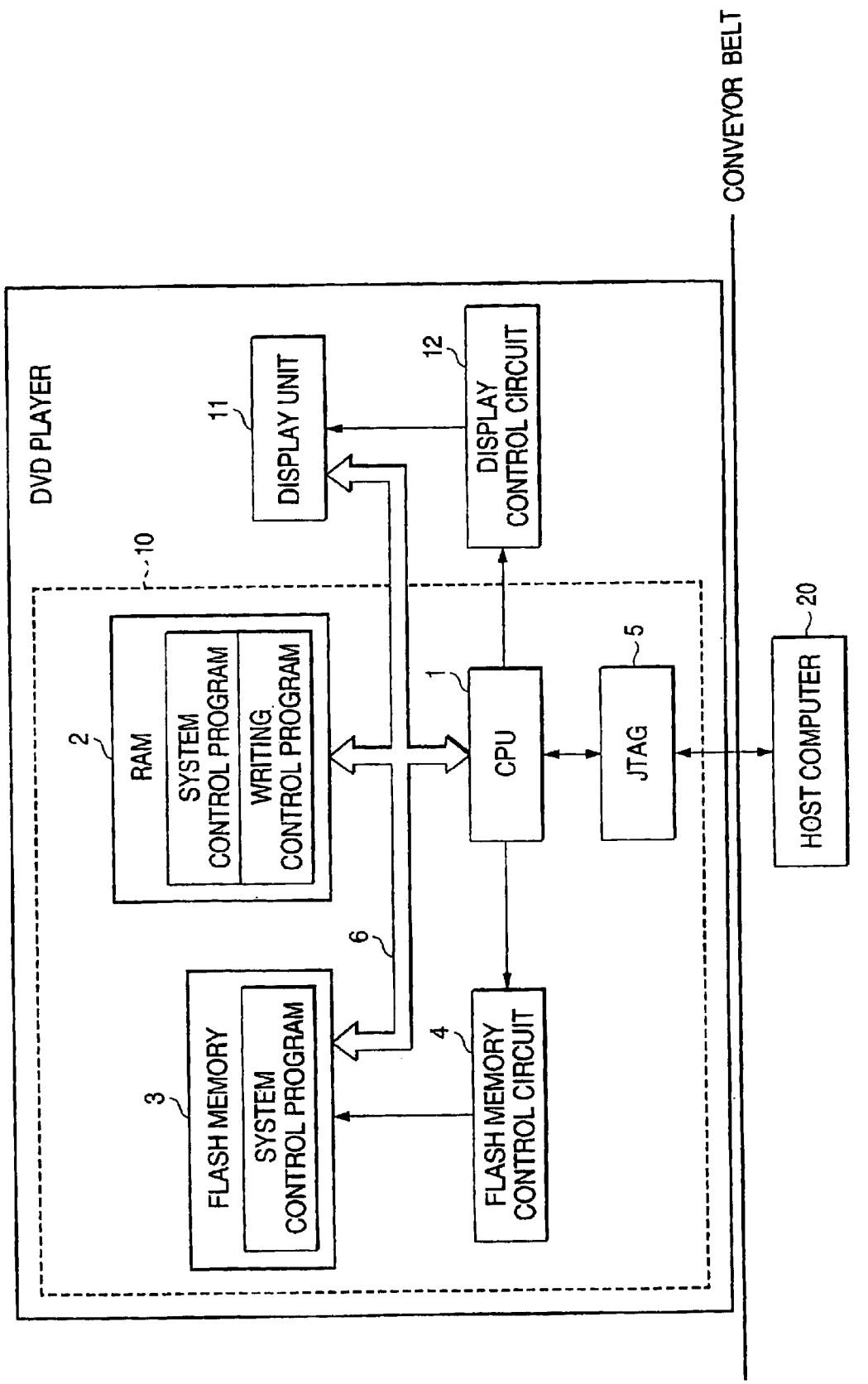
FIG. 4 shows that a DVD player according to an embodiment of the present invention is conveyed on the conveyor belt.

An embodiment of the invention will be described below in detail suitably with reference to the drawings. FIG. 1 is a block diagram showing the configuration of a system for updating firmware according to an embodiment of the invention. FIG. 2 is a flow chart showing the operation of transferring programs and sending a control command in the system according to an embodiment of the invention. FIG. 3 is a flow chart showing the operation of writing a program in the system according to an embodiment of the invention.

First, this embodiment will be explained below with reference to the block diagram of FIG. 1 showing the configuration of the system for updating firmware.

A microprocessor portion 10 of an electronic device has a CPU (central processing unit) 1 to control the electronic device, a flash memory 3 to store a system control program executed by the CPU 1, and a RAM 2 provided for the CPU 1 to temporarily store the results of operation and data. The CPU 1, the flash memory 3, and the RAM 2 are connected to one another through a system bus 6.

The flash memory 3 is an electrically erasable/writable nonvolatile memory. The flash memory 3 has functions as firmware. A control signal from the CPU 1 and a control signal from a flash memory control circuit 4 connected to the flash memory are applied to pins of the flash memory 3 at predetermined timing. Thus, data in the flash memory 3 can be erased and rewritten. A writing time for the flash memory is about 1 min/M bites.

The RAM 2 is in general a memory to temporarily store data such as the results of the operation at the time the CPU 1 controls the electronic device. When the CPU 1 rewrites the firmware of the electronic device, the RAM 2 is used as a memory to temporarily store a system control program and a writing control program, which controls writing operation to load the system control program into the flash memory. A writing time for the RAM is about 20 sec/M bites. Thus, the RAM writes about five times as fast as the flash memory.

In addition, a display unit 11, which displays various kinds of information regarding operating states of the electronic device, is connected to the microprocessor portion 10 through the system bus 6. In accordance with a control signal from the CPU 1 and a control signal from a display control circuit 12 connected to the display unit 11, an indication of a normal termination based on writing a program into the flash memory, a write error in writing a program into the flash memory, and a verification error in verifying the program written in the flash memory, as well as the various kinds of information such as the operating states of the electronic device, are displayed oti the display unit 11 while firmware of the electronic device is being updated.

The CPU 1 of the microprocessor portion 10 and a host computer 20 are connected through a JTAG (Joint Test Action Group) interface 5. Data such as programs, and various control commands are transferred from the host computer 20 to the CPU 1 of the microprocessor portion 10 through the JTAG interface 5 so that the operation of the CPU 1 can be controlled from the outside.

The JTAG interface 5 is an interface based on a JTAG system in conformity with the standard 1149.1 of IEEE (the Institute of Electrical and Electronics Engineers). The JTAG interface 5 can control a CPU of an electronic device from the outside through the JTAG interface.

In the process of updating firmware, the host computer 20 transfers the system control program and the writing control program to the CPU 1 of the microprocessor portion 10 through the JTAG interface 5. Subsequently, the host computer 20 issues a command to write the transferred programs into the RAM 2, and sends the CPU 1 a run command to activate the writing control program stored in the RAM 2. Thus, the host computer 20 can control the CPU 1 to write the system control program stored in the RAM 2 into the flash memory 3.

Next, this embodiment of the invention will be further explained with reference to the flow chart of FIG. 2 showing the operation of transferring the programs and sending the control command in the system.

When the host computer 20 and the electronic device are connected through the JTAG interface and then transferring the system control program from the host computer is set up, the process in the flow chat goes from Step S1 to Step S2. At Step S2, the system control program is transferred from the host computer to the electronic device, and the transferred system control program is loaded into predetermined addresses of the RAM of the electronic device. Then, the process goes to Step S3.

At Step S3, it is judged whether the system control program has been loaded into the RAM of the electronic device or not. If the system control program has been written, the process will go to Step S4. If the system control program has not been written, the process will return to Step S2 to repeat Step S2 and Step S3 so as to keep on writing the system control program into the RAM of the electronic device.

At Step S4, the writing control program to perform writing operation that the system control program is loaded into the flash memory of the electronic device is transferred from the host computer to the electronic device. The transferred writing control program is written into predetermined addresses of the RAM of the electronic device. Then, the process goes to Step S5.

At Step S5, it is judged whether the writing control program has been written into the RAM of the electronic device or not. If the writing control program has been written, the process will go to Step S6. If the writing control program has not been written, the process will return to Step S4 to repeat Step S4 and Step S5 so as to keep on writing the writing control program into the RAM of the electronic device.

At Step S6, the run command, which causes the writing control program to activate, is sent from the host computer to the electronic device. Then, the process goes to Step S7, in which the process of transferring the programs and sending the control command is terminated.

Incidentally, the writing control program may be written into the RAM of the electronic device before the system control program.

In addition, the host computer 20 and the electronic device may be disconnected after the run command is sent to the electronic device.

Further, this embodiment of the invention will be explained with reference to the flow chart of FIG. 3 showing the writing operation in the system.

When the control command is sent from the host computer 20 to the electronic device, the process goes from Step S11 to Step S12. At Step S12, the writing control program stored in the RAM is executed from a predetermined address, and contents of the flash memory are erased. Then, the process goes to Step S13.

At Step S13, in accordance with the execution of the writing control program, the operation to write the system control program stored in the RAM into predetermined addresses of the flash memory starts. Then, the process goes to Step S14.

At Step S14, it is judged whether a write error in writing into the flash memory has occurred or not. If a write error has occurred in writing into the flash memory, the process will go to Step S16. If no write error has occurred in writing into the flash memory, the process will go to Step S15.

At Step S15, it is judged whether the system control program has been written into the flash memory or not. If the system control program has been written, the process will go to Step S17. If the system control program has not been written, the process will return to Step S13 to repeat Step S13 to Step S15 so as to keep on writing the system control program into the flash memory.

At Step S16, a write error caused upon writing into the flash memory is displayed. Then, the process goes to Step S22, in which the operation of writing the system control program into the flash memory is interrupted, and the writing operation is terminated.

At Step S17, the contents of the system control program written into the flash memory are compared with the contents of the system control program stored in the RAM. Then, the process goes to Step S18.

At Step S18, it is judged whether the contents of the system control program loaded into the flash memory matches the contents of the system control program stored in the RAM or not. If the contents of the programs do not coincide, the process will go to Step S21. If the contents of the programs coincide, the process will go to Step S19. At Step S19, it is judged whether the verification has been completed or not.

If the verification has been done, the process will go to Step S20. If the verification has not been done, the process will return to Step S17 to repeat Step S17 to Step S19 so as to keep on verifying the contents of the programs.

At Step S21, a verification error retrieved during verifying the system control program loaded into the flash memory is displayed. Then, the process goes to Step S22, in which writing the system control program into the flash memory is interrupted, and the writing operation is terminated.

At Step S20, when there is neither write error nor verification error in loading the system control program into the flash memory, a normal indication regarding termination is displayed. Then, the process goes to Step S22, in which the process of writing the system control program into the flash memory is terminated.

Incidentally, although the write error and/or the verification error during loading into the flash memory were displayed and the writing operation was then interrupted and terminated, the contents of the flash memory may be erased again and the writing operation may be repeated.

As described above, according to the invention, the system control program to be written into the flash memory and the writing control program are temporarily stored in the RAM. The writing control program stored in the RAM is executed so that the system control program stored in the RAM can be written into the flash memory. In addition, when the write error occurs upon writing of the system control program stored in the RAM into the flash memory, the write error can be displayed. Further, when the contents of the system control program written in the flash memory does not match the contents of the system control program stored in the RAM, the verify error can be displayed. Thus, the system control program may not be stored in a ROM.

In the system according to the invention, by the control based on a JTAG system, the system control program to control the electronic device and the writing control program to perform the writing operation are temporarily stored in a random access memory, and the writing control program stored in the random access memory is executed so that the system control program stored in the random access memory is written into the flash memory. When a write error occurs upon writing the system control program into the flash memory, the write error is displayed. Further, when the contents of the system control program written in the flash memory does not match the contents of the system control program stored in the random access memory, a verify error is displayed.

In the system according to the invention, the system control program to control the electronic device and the writing control program to perform the writing operation are temporarily stored, and the stored writing control program is executed so that the system control program is written.

In the system according to the invention, the system control program to control the electronic device is stored in a flash memory.

In the system according to the invention, the system control program to control the electronic device and the writing control program to perform the writing operation are temporarily stored in a random access memory.

In the system according to the invention, the system is controlled by a JTAG system.

In the system according to the invention, when the write error occurs upon writing of the system control program, the write error is displayed.

In the writing system according to the invention, the write error in writing the system control program is displayed on a display unit of the electronic device.

In the system according to the invention, the written system control program is verified, and the verification error is displayed when the contents of the written system control program does not coincide.

In the system according to the invention, the verify error retrieved during verifying the written system control program is displayed on a display unit of the electronic device.

In the manufacturing process, the electronic device can be separated from the host computer. Accordingly, the system control program can be transferred from the first storage unit to the second storage unit while the electronic device is conveyed on a conveyor line. Thus, the manufacturing time can be shortened. That is, according to the invention, the time of the writing step for which it takes about 95 seconds in the related art can be shortened to about 10 seconds. Thus, the conveyor speed in the manufacturing line can be increased on a large scale.

Besides, the present invention is applicable to any home electric appliances as well as a DVD player.

Due to the present invention, since the program is transferred from a RAM with being conveyed on a conveyor belt during the manufacture, it is possible to shorten a manufacturing time.

What is claimed is:

1. A system for updating a system control program of an electronic device, comprising:
   a JTAG interface;
   a control unit connected to the JTAG interface;
   a flash memory connected to said control unit;
   a random access memory connected to said control unit; and
   a display unit for displaying predetermined information to a user; wherein
      said control unit loads the system control program and a writing control program transferred via said JTAG interface from an external computer into said random access memory, and executes the writing control program stored in said random access memory to load the system program into said flash memory; and
      said display unit displays a write error when the write error occurs during loading the system control program stored in said random access memory into said flash memory, and displays a verification error when contents of the system control program loaded in said flash memory does not match contents of the system control program stored in said random access memory.

2. A system for updating a system control program of an electronic device, comprising:
   a first storage unit for storing a system control program to control said electronic device;

a second storage unit for temporarily storing the system control program and a writing control program to load the system control program into said first storage unit; and a control unit for loading the system control program and the writing control program transferred from an external computer into said second storage unit, and executing the writing control program stored in said second storage unit.

3. The system according to claim 2, wherein said first storage unit is a flash memory.

4. The system according to claim 2, wherein said second storage unit is a random access memory.

5. The system according to claim 2, wherein said control unit is controlled by the external computer via a JTAG interface.

6. The system according to claim 2, further comprising:

a write error display unit for displaying a write error when the write error occurs during loading the system control program stored into said second storage unit into said first storage unit.

7. The system according to claim 6, wherein said write error display unit is a display device.

8. The system according to claim 2, further comprising:

a verify error display unit for displaying a verify error when contents of the system control program stored in said first storage unit does not match contents of the system control program stored in said second storage unit.

9. The system according to claim 8, wherein said verify error display unit is a display device.

10. A method for updating a system control program of an electronic device, comprising:

(a) connecting a host computer to a JTAG interface of said electronic device;

(b) temporarily storing a system control program and a writing control program transferred from said host computer into a second storage unit, wherein the writing control program performs writing operation to load the system control program into a first storage unit;

(c) detaching said host computer from said JTAG interface;

(d) conveying said electronic device; and (e) executing said writing control program stored in said second storage unit.

11. The method according to claim 10, wherein said first storage unit is a flash memory.

12. The method according to claim 10, wherein said second storage unit is a random access memory.

13. The method according to claim 10, wherein the step (b) is controlled under a JTAG system.

14. The method according to claim 10, further comprising:

displaying a write error when said write error occurs during loading said system control program stored into said second storage unit into said first storage unit.

15. The method according to claim 10, further comprising:

displaying a verify error when contents of said system control program loaded in said first storage unit does not match contents of said system control program stored in said second storage unit.

* * * * *